(12) United States Patent
Cook

(10) Patent No.: US 10,274,572 B2
(45) Date of Patent: Apr. 30, 2019

(54) CALIBRATION SYSTEM FOR A POWER METER

(71) Applicant: Veris Industries, LLC, Tualatin, OR (US)

(72) Inventor: Martin Cook, Tigard, OR (US)

(73) Assignee: Veris Industries, LLC, Tualatin, OR (US)

( * ) Notice: Subject to any disclaimer, the term of this patent is extended or adjusted under 35 U.S.C. 154(b) by 0 days.

(21) Appl. No.: 15/185,739

(22) Filed: Jun. 17, 2016

(65) Prior Publication Data

US 2017/0184697 A1    Jun. 29, 2017

Related U.S. Application Data

(60) Provisional application No. 62/271,416, filed on Dec. 28, 2015.

(51) Int. Cl.
  *G01R 35/00* (2006.01)
  *G01R 21/06* (2006.01)

(52) U.S. Cl.
  CPC ........... *G01R 35/005* (2013.01); *G01R 21/06* (2013.01)

(58) Field of Classification Search
  CPC ...... G01R 35/005; G01R 35/04; G01R 21/06; G01R 21/133; G01R 11/04; G01R 19/2513; G01D 4/004; G01D 4/002
  See application file for complete search history.

(56) References Cited

U.S. PATENT DOCUMENTS

| | | |
|---|---|---|
| 1,100,171 A | 6/1914 | Brown |
| 1,455,263 A | 5/1923 | Oberfell |
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa |
| 2,412,782 A | 12/1946 | Palmer |
| 2,428,613 A | 10/1947 | Boyajian |
| 2,663,190 A | 12/1953 | Ilgenfritz |

(Continued)

FOREIGN PATENT DOCUMENTS

| | | |
|---|---|---|
| EP | 1531334 A2 | 5/2005 |
| WO | 2016176315 A1 | 11/2016 |

*Primary Examiner* — Tung X Nguyen
*Assistant Examiner* — Lee E Rodak
(74) *Attorney, Agent, or Firm* — Chernoff, Vilhauer, McClung & Stenzel, LLP

(57) ABSTRACT

A system for calibrating a power meter may include mechanically detachably electrically engaging a first power meter with a second power meter. The first power meter may receive a first current input signal representative of a current level in a first conductor to a load and receive a first voltage input signal representative of a voltage level in the first conductor, and determine a first power level based upon the first current input signal and the first voltage input signal. A second power meter may receive a second current input signal representative of the current level in the first conductor to the load from the first power meter, receive a second voltage input signal representative of the voltage level in the first conductor to the load from the first power meter, and determine a second power level based upon the second current input signal and the second voltage input signal.

18 Claims, 16 Drawing Sheets

(56) References Cited

U.S. PATENT DOCUMENTS

| | | |
|---|---|---|
| 2,746,295 A | 5/1956 | Lubkin |
| 2,802,182 A | 8/1957 | Goldshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Ebert |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Tipton et al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |
| 3,955,701 A | 5/1976 | Fisch |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Speidel et al. |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah |
| 5,365,462 A | 11/1994 | McBean |
| D354,945 S | 1/1995 | Dellavecchia et al. |
| 5,384,712 A | 1/1995 | Oravetz et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,495,167 A * | 2/1996 | Cotroneo ............... G01R 35/04 324/74 |
| 5,548,209 A | 8/1996 | Lusignan et al. |
| 5,563,506 A | 10/1996 | Fielden et al. |
| 5,572,073 A | 11/1996 | Burgess et al. |
| 5,578,927 A | 11/1996 | Perelle |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,677,476 A | 10/1997 | McCarthy et al. |
| 5,705,989 A | 1/1998 | Cota et al. |
| 5,712,558 A | 1/1998 | Saint-Cyr |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |

(56) References Cited

U.S. PATENT DOCUMENTS

| | | | |
|---|---|---|---|
| 6,044,430 A | 3/2000 | MacDonald | |
| 6,046,550 A | 4/2000 | Ference et al. | |
| 6,064,192 A | 5/2000 | Redmyer | |
| 6,091,023 A | 7/2000 | O'Donnell | |
| 6,122,972 A | 9/2000 | Crider | |
| 6,124,791 A | 9/2000 | Wolf | |
| D431,534 S | 10/2000 | Holce et al. | |
| 6,133,709 A | 10/2000 | Puchianu | |
| 6,133,723 A | 10/2000 | Feight | |
| 6,137,418 A | 10/2000 | Zuercher et al. | |
| 6,146,109 A | 11/2000 | Davis et al. | |
| 6,236,949 B1 | 5/2001 | Hart | |
| 6,269,317 B1 | 7/2001 | Schachner et al. | |
| 6,308,140 B1 | 10/2001 | Dowling et al. | |
| 6,330,516 B1 | 12/2001 | Kammeter | |
| 6,331,821 B1 | 12/2001 | Holce et al. | |
| 6,344,951 B1 | 2/2002 | Sato et al. | |
| 6,351,206 B1 | 2/2002 | Schweiger et al. | |
| 6,373,238 B2 | 4/2002 | Lewis et al. | |
| 6,377,430 B2 | 4/2002 | Holce et al. | |
| 6,380,696 B1 | 4/2002 | Sembhi et al. | |
| 6,384,946 B1 | 5/2002 | Pitsch et al. | |
| 6,404,166 B1 | 6/2002 | Puchianu | |
| 6,414,241 B1 | 7/2002 | O'Donnell | |
| D466,078 S | 11/2002 | Bowman | |
| 6,496,378 B2 | 12/2002 | Holce et al. | |
| 6,504,357 B1 | 1/2003 | Hemminger et al. | |
| 6,504,695 B1 | 1/2003 | Holce et al. | |
| 6,549,859 B1 | 4/2003 | Ward | |
| 6,591,482 B1 | 7/2003 | Fleege et al. | |
| D478,313 S | 8/2003 | Bowman | |
| 6,615,147 B1 | 9/2003 | Jonker et al. | |
| 6,636,028 B2 | 10/2003 | Lavoie et al. | |
| 6,657,424 B1 | 12/2003 | Voisine et al. | |
| 6,737,854 B2 | 5/2004 | Bruno et al. | |
| 6,756,776 B2 | 6/2004 | Perkinson et al. | |
| 6,774,803 B1 | 8/2004 | Tiffin | |
| 6,809,509 B2 | 10/2004 | Bruno et al. | |
| 6,815,942 B2 * | 11/2004 | Randall | G01R 35/04 324/142 |
| 6,825,771 B2 | 11/2004 | Bruno et al. | |
| 6,856,515 B2 | 2/2005 | Holce et al. | |
| 6,861,683 B2 | 3/2005 | Rissing et al. | |
| 6,871,827 B2 | 3/2005 | Petak et al. | |
| 6,888,712 B2 | 5/2005 | Holce et al. | |
| 6,889,271 B1 | 5/2005 | Germer et al. | |
| 6,937,003 B2 | 8/2005 | Bowman et al. | |
| 6,950,292 B2 | 9/2005 | Holce et al. | |
| 6,988,043 B1 | 1/2006 | Randall | |
| 7,006,934 B2 | 2/2006 | Jonker et al. | |
| 7,053,497 B2 | 5/2006 | Sodemann et al. | |
| 7,157,899 B2 | 1/2007 | Bruno | |
| 7,161,345 B2 | 1/2007 | Bruno | |
| 7,193,428 B1 | 3/2007 | Baron et al. | |
| 7,212,930 B2 | 5/2007 | Bruno | |
| 7,221,145 B2 | 5/2007 | Bowman et al. | |
| 7,230,414 B2 | 6/2007 | Bruno | |
| 7,239,810 B2 | 7/2007 | Seely et al. | |
| 7,274,187 B2 | 9/2007 | Loy | |
| 7,282,889 B2 | 10/2007 | Freed et al. | |
| 7,310,049 B2 | 12/2007 | Bowman | |
| 7,312,686 B2 | 12/2007 | Bruno | |
| 7,312,964 B2 | 12/2007 | Tchernobrivets | |
| 7,330,022 B2 | 2/2008 | Bowman et al. | |
| 7,333,345 B2 | 2/2008 | Holce et al. | |
| 7,352,287 B2 | 4/2008 | Rupert | |
| 7,359,809 B2 | 4/2008 | Bruno | |
| 7,447,603 B2 | 11/2008 | Bruno | |
| 7,453,267 B2 | 11/2008 | Westbrock, Jr. et al. | |
| 7,474,088 B2 | 1/2009 | Bowman et al. | |
| 7,477,998 B2 * | 1/2009 | Kagan | G01D 4/004 324/114 |
| 7,652,871 B2 | 1/2010 | Caggiano et al. | |
| 8,085,055 B2 | 12/2011 | Rupert | |
| 8,193,803 B2 | 6/2012 | Bose et al. | |
| 8,212,548 B2 | 7/2012 | Parker et al. | |
| 8,212,549 B2 | 7/2012 | McNulty et al. | |
| 8,294,453 B2 | 10/2012 | Bowman | |
| 8,405,383 B2 | 3/2013 | Agrawal et al. | |
| 8,421,443 B2 | 4/2013 | Bitsch et al. | |
| 8,610,438 B1 | 12/2013 | Sykora et al. | |
| 8,612,792 B2 | 12/2013 | Fu et al. | |
| 8,837,118 B2 | 9/2014 | McGrail | |
| 8,878,475 B2 | 11/2014 | Bonvin et al. | |
| 8,964,360 B2 | 2/2015 | Trout | |
| 8,988,062 B2 | 3/2015 | Sykora et al. | |
| 9,146,264 B2 | 9/2015 | Cook | |
| 9,329,659 B2 | 5/2016 | Cook | |
| 9,395,344 B2 | 7/2016 | Sheley | |
| 9,424,975 B2 | 8/2016 | Cook et al. | |
| 9,577,443 B2 | 2/2017 | Gach et al. | |
| 9,588,148 B2 | 3/2017 | Cook et al. | |
| 9,607,749 B2 | 3/2017 | Cook et al. | |
| 2001/0040446 A1 | 11/2001 | Lapinksi | |
| 2002/0109499 A1 * | 8/2002 | Carlson | G01R 21/133 324/142 |
| 2004/0227503 A1 | 11/2004 | Bowman | |
| 2005/0240362 A1 | 10/2005 | Randall | |
| 2006/0085144 A1 | 4/2006 | Slota et al. | |
| 2006/0103548 A1 | 5/2006 | Borkowski et al. | |
| 2006/0164096 A1 | 7/2006 | Kwon | |
| 2006/0181242 A1 | 8/2006 | Freed | |
| 2006/0193099 A1 * | 8/2006 | Schweitzer, III | H02H 1/0061 361/115 |
| 2006/0238932 A1 | 10/2006 | Westbrock | |
| 2007/0153438 A1 | 7/2007 | Caggiano et al. | |
| 2008/0284614 A1 * | 11/2008 | Perez | G01R 22/065 340/870.02 |
| 2008/0303511 A1 | 12/2008 | Gmo | |
| 2009/0066527 A1 * | 3/2009 | Teachman | G01R 22/10 340/657 |
| 2009/0115400 A1 | 5/2009 | Hunter | |
| 2009/0115620 A1 | 5/2009 | Hunter | |
| 2009/0295370 A1 | 6/2009 | Parker | |
| 2009/0234512 A1 * | 9/2009 | Ewing | H04L 12/10 700/295 |
| 2010/0117626 A1 | 5/2010 | Wertz et al. | |
| 2010/0176960 A1 | 7/2010 | Bitsch | |
| 2010/0207604 A1 | 8/2010 | Bitsch et al. | |
| 2010/0235122 A1 | 9/2010 | McCrea | |
| 2010/0308792 A1 | 12/2010 | Rupert | |
| 2011/0098985 A1 | 4/2011 | Lawson | |
| 2011/0151699 A1 * | 6/2011 | Schafmeister | H01R 4/4836 439/266 |
| 2011/0169502 A1 * | 7/2011 | Reichel | G01R 35/005 324/601 |
| 2011/0181124 A1 | 7/2011 | Uesaka | |
| 2012/0112681 A1 | 5/2012 | Bonvin | |
| 2012/0221278 A1 | 8/2012 | Cook | |
| 2012/0235667 A1 | 9/2012 | Agrawal et al. | |
| 2013/0024714 A1 | 1/2013 | Fu et al. | |
| 2013/0027818 A1 | 1/2013 | McGrail | |
| 2013/0144545 A1 | 6/2013 | Fu et al. | |
| 2013/0294014 A1 | 11/2013 | Irons | |
| 2014/0239964 A1 | 8/2014 | Gach et al. | |
| 2015/0028848 A1 | 1/2015 | Lynch et al. | |
| 2015/0061636 A1 * | 3/2015 | Tsai | G01R 35/005 324/74 |
| 2015/0293549 A1 | 10/2015 | Lal et al. | |
| 2016/0187449 A1 * | 6/2016 | Beiner | G01R 35/005 324/74 |
| 2016/0259026 A1 * | 9/2016 | Leidy | G01R 35/04 |
| 2017/0090004 A1 * | 3/2017 | Marshall | G01R 21/133 |

* cited by examiner

CALIBRATION SYSTEM FOR A POWER METER

CROSS-REFERENCE TO RELATED APPLICATIONS

This application claims the benefit of U.S. Provisional App. No. 62/271,416, filed Dec. 28, 2015.

BACKGROUND OF THE INVENTION

The present invention relates to a calibration system for a power meter.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Digital branch current monitors may incorporate data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

While such power metering devices tend to be effectively calibrated to provide accurate results upon initial installation, over time they tend to drift and age, thereby reducing the accuracy of their results.

What is desired, therefore, is a power metering system that may be effectively recalibrated, if desired.

DETAILED DESCRIPTION OF PREFERRED EMBODIMENTS

Figure 1:
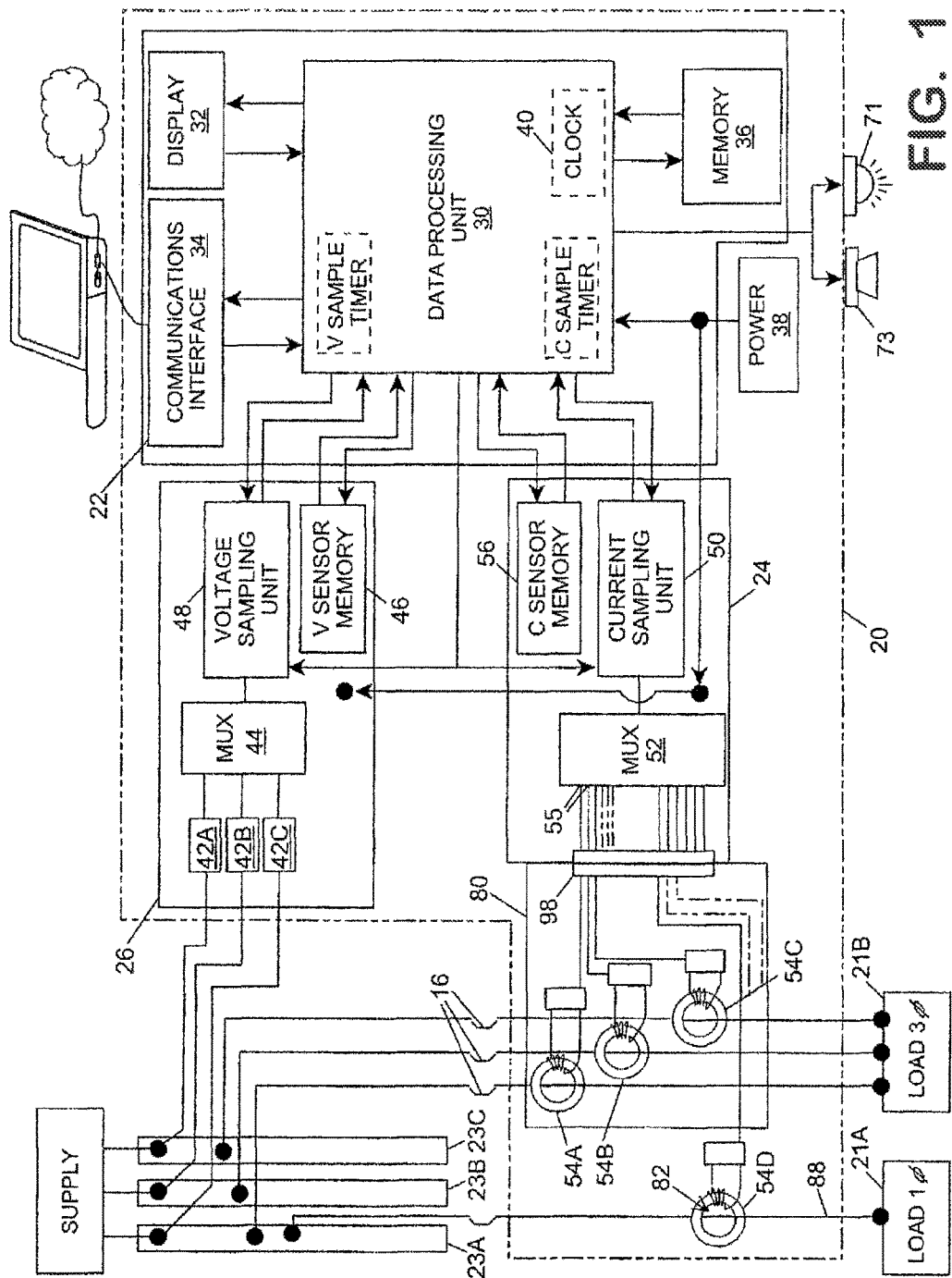
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The branch current monitor 20 is preferably housed in a housing and/or the data processing module 22 is preferably housed in a housing and/or the current module 24 is preferably housed in a housing and/or the voltage module is preferably housed in a housing. In some embodiments, the branch current monitor and/or the data processing module and/or the current module and/or the voltage module includes one or more connectors suitable to detachably connect a separate power meter to sense electrical properties of the branch current monitor and/or the data processing module and/or the current module and/or the voltage module. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 2:
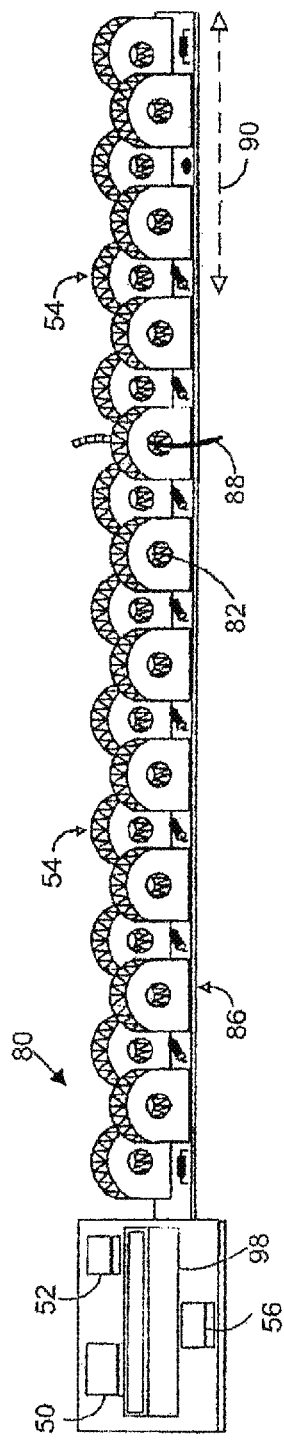
FIG. 2 is a perspective view of a current transformer strip for a branch current monitor.
Figure 3:
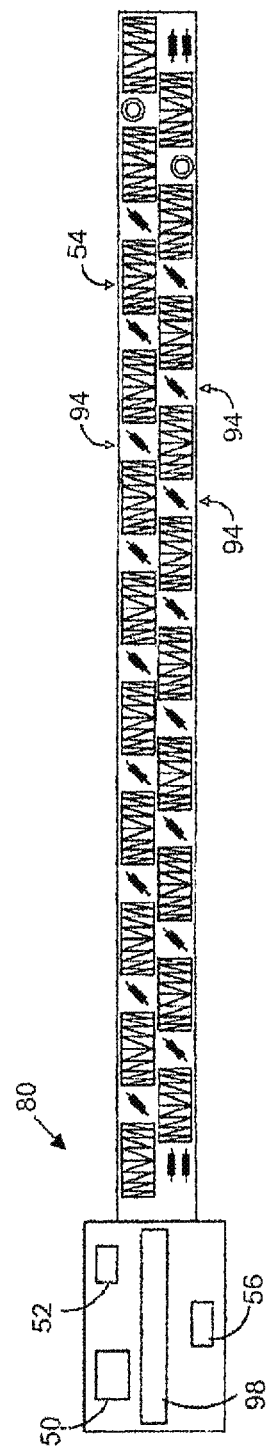
FIG. 3 is a top view of the current transformer strip of FIG. 2.
Figure 4:
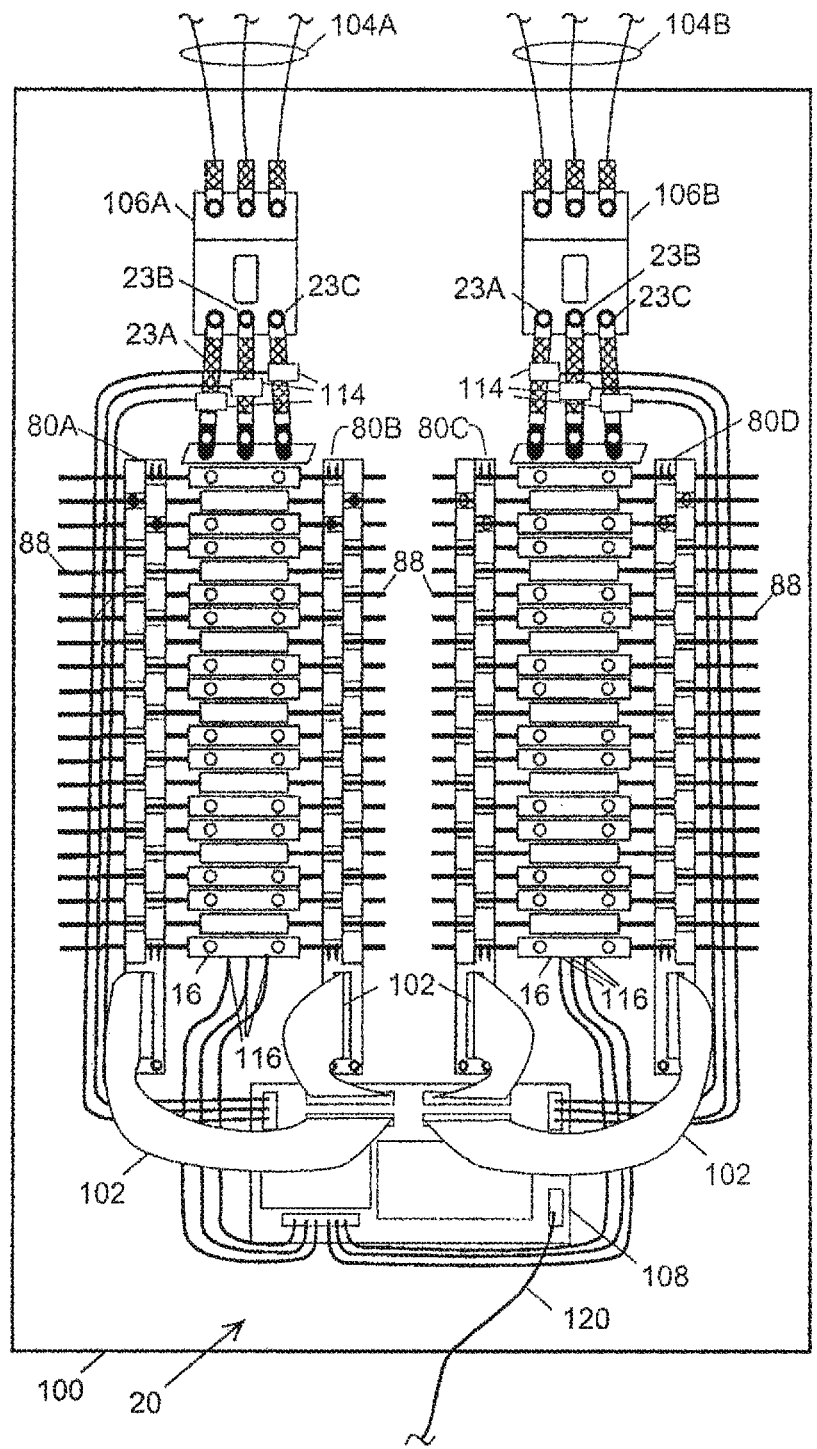
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition, the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network. The main acquisition circuit board 108 is preferably housed in a housing. In some embodiments, the main acquisition circuit board 108 includes one or more connectors suitable to detachably connect a separate power meter to sense electrical properties of the current and/or voltage being sensed. The strips or support units may be housed in a housing, in whole or in part. In some embodiments, the strips or support units includes one or more connectors suitable to detachably connect a separate power meter to sense electrical properties of the current and/or voltage being sensed.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The main acquisition board 108 is preferably housed in a housing. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
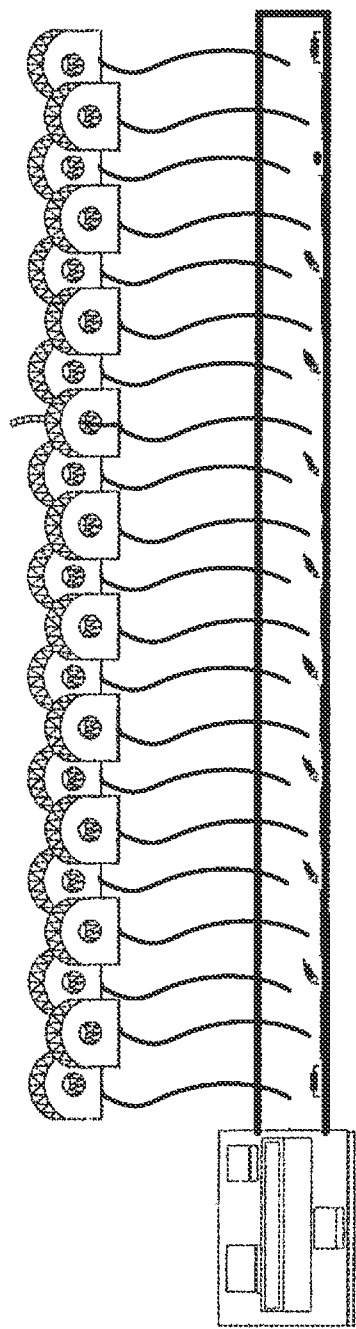
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board. All or a portion of the strip unit is preferably housed in a housing. The strips unit may be housed in a housing, in whole or in part. In some embodiments, the strip unit includes one or more connectors suitable to detachably connect a separate power meter to sense electrical properties of the strip unit.

Figure 6:
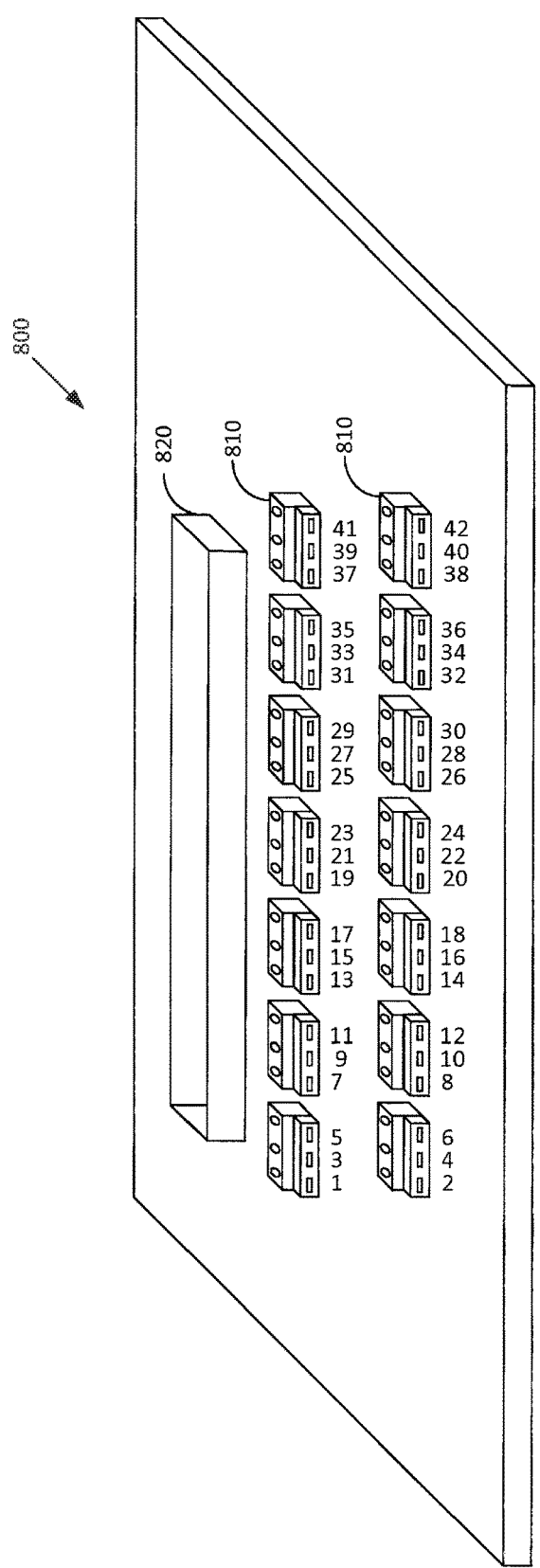
FIG. 6 illustrates a view of a connector board for a branch current monitor.

Referring to FIG. 6, another embodiment includes a set of one or more connector boards 800 in addition to or as an alternative to the strip units. Each of the connector boards may include a set of connectors 810 that may be used to interconnect a current transformer thereto. Each of the connector boards may include a connector 820 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B. All or a portion of the connector board is preferably housed in a housing. In some embodiments, the connector board includes one or more connectors suitable to detachably connect a separate power meter to sense electrical properties of the connector board.

Figure 7:
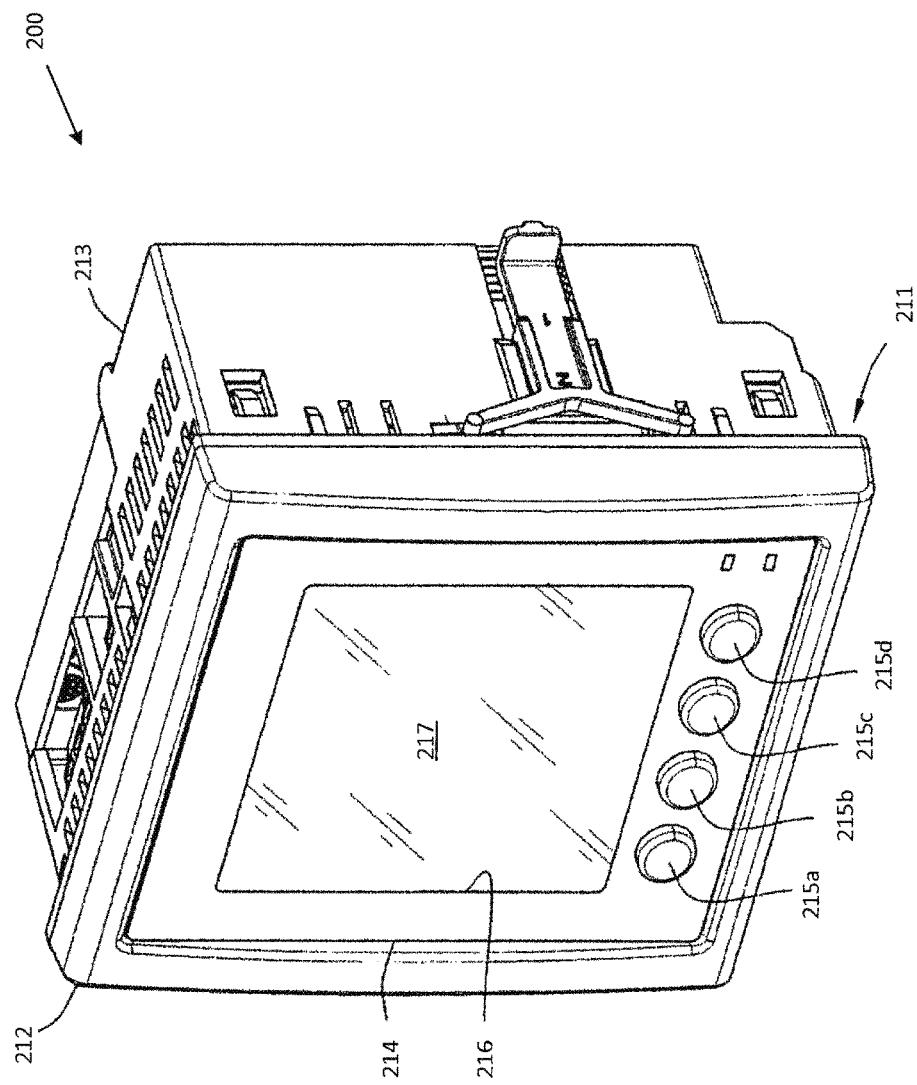
FIG. 7 illustrates an exemplary embodiment of a power meter.
Figure 8:
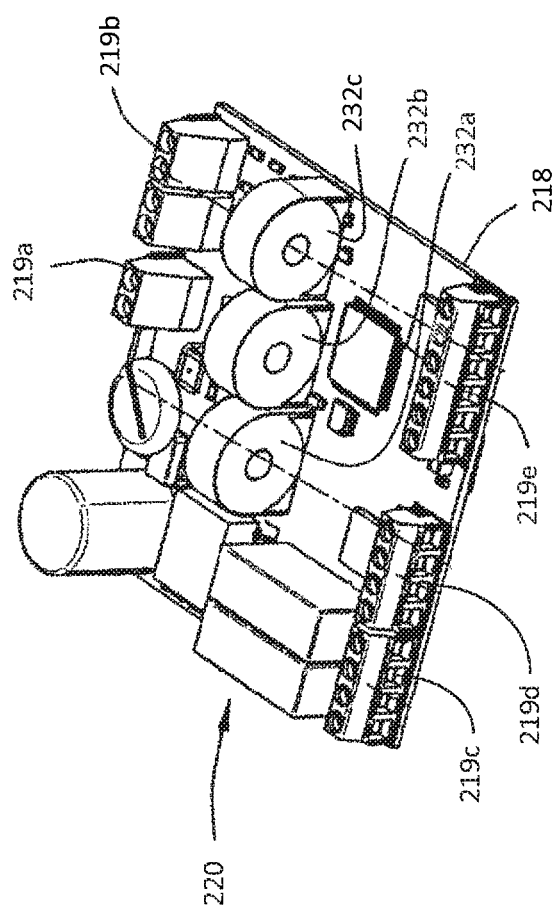
FIG. 8 illustrates a circuit board included within the power meter of FIG. 7.

Referring to FIG. 7, another embodiment of a power meter 200 is housed in a housing 211 formed by a front bezel 212 and a back cover 213 that snap together. The front bezel 212 may be bonded to a user-interface panel 214 that contains four manually operable pushbuttons 215a-215d and a central window 216 for viewing a display 217, such as an LCD; attached to the bezel 212. Behind the display 217 is a printed circuit board 218 (see FIG. 8) that has multiple terminal blocks 219a-219e and associated circuitry 220 mounted on one or both sides of the board 218. The terminal blocks 219a and 219b are used to connect the circuitry 220 to a control power supply and voltage input lines, respectively. For example, the voltage lines may be from the power panel or from the wire to the load(s). In addition the same voltage lines, for example from the power panel or the wire to the load, may further be extended to pass through a respective current transformer to sense the current therein. Also, a respective current sensor of a set of one or more current transformers may encircle a respective wire to a load, where the wires from the respective current transformer being interconnected to suitable terminals of one or more of the terminal blocks. In this manner, the power meter is capable of sensing or otherwise receiving signals representative of the voltage and current in the wires to the load(s). Terminal block 219c may be used to connect digital outputs of the circuitry 220, such as demand sync signals, alarm signals or external control signals, to relays, motors, meters or other devices. Terminal block 129d may be an RS485 port used for communicating with a monitoring and control system and can be daisy chained to multiple devices. Terminal block 219e may be used to receive digital inputs for determining circuit breaker status, counting pulses, counting motor starts, accepting demand sync pulses, and/or input metering. The terminal blocks 219a-219e and the circuitry 220 (simplified for purposes of illustration) may be used to monitor either a single-phase, a two-phase, and/or a three-phase electrical power distribution system. Typically the meter is used to measure currents and voltages and report in real time their root-mean-square values, which includes values for all three phases and neutral in the case of a three-phase power distribution system. The meter also typically calculates power factor, real power, reactive power and other electrical parameters. In some embodiments, the housing 211 includes one or more connectors suitable to detachably connect a separate power meter to sense electrical properties of the current and/or voltage being sensed.

Figure 9:
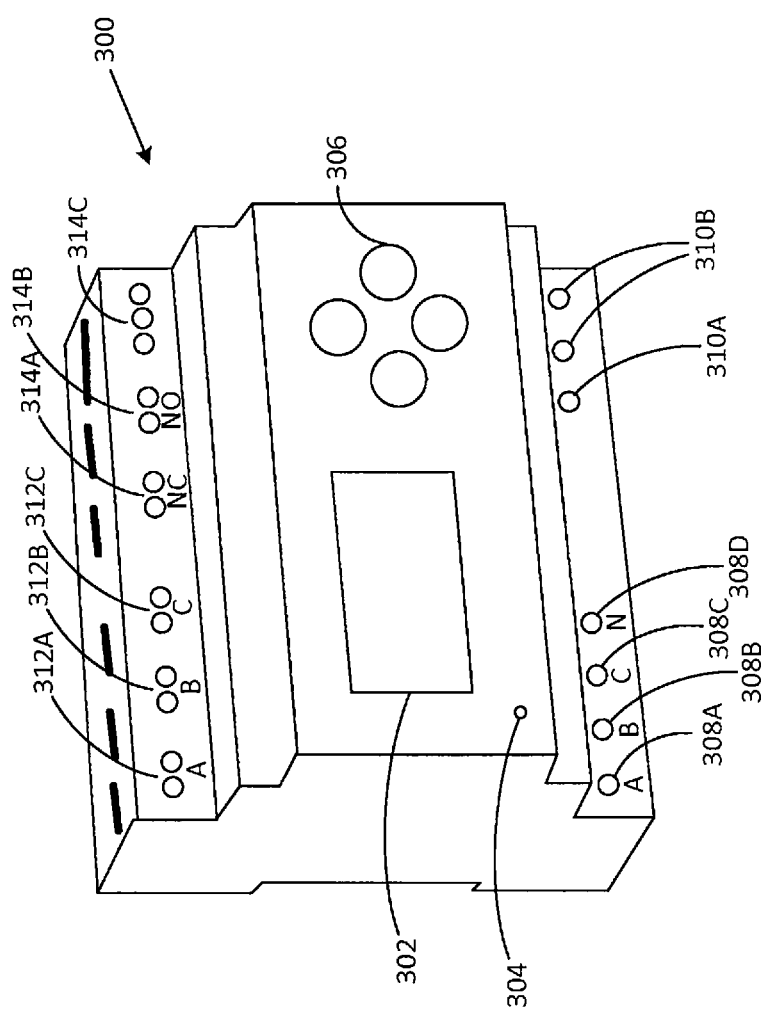
FIG. 9 illustrates another exemplary embodiment of a power meter.

Referring to FIG. 9, another embodiment of a power meter 300 housed within a housing suitable to be mounted to a standard 35 mm DIN rail or screw-mounted to the interior surface of an enclosure. The power meter 300 may include an alphanumeric display 302 to display information, such as power usage and the type thereof. The power meter 300 may include an alarm light 304 when an alarm condition occurs. The power meter 300 may include a set of configuration buttons 306. The power meter may include a set of voltage inputs, such as voltage A 308A, voltage B 308B, voltage C 308C, and voltage neutral 308D. The power meter 300 may also include an earth ground 310A and control power 310B. The power meter 300 may sense the current by using current transformers that are respectively interconnected to current sensor input phase A 312A, current sensor input phase B 312B, and/or current sensor input phase C 312C. The power meter 300 may have a set of outputs, such as a normally closed phase loss alarm 314A, a normally open pulse output representative of energy usage 314B, and other outputs 314C. In some embodiments, the power meter 300 includes one or more connectors suitable to detachably connect a separate power meter to sense electrical properties of the current and/or voltage being sensed.

Figure 10:
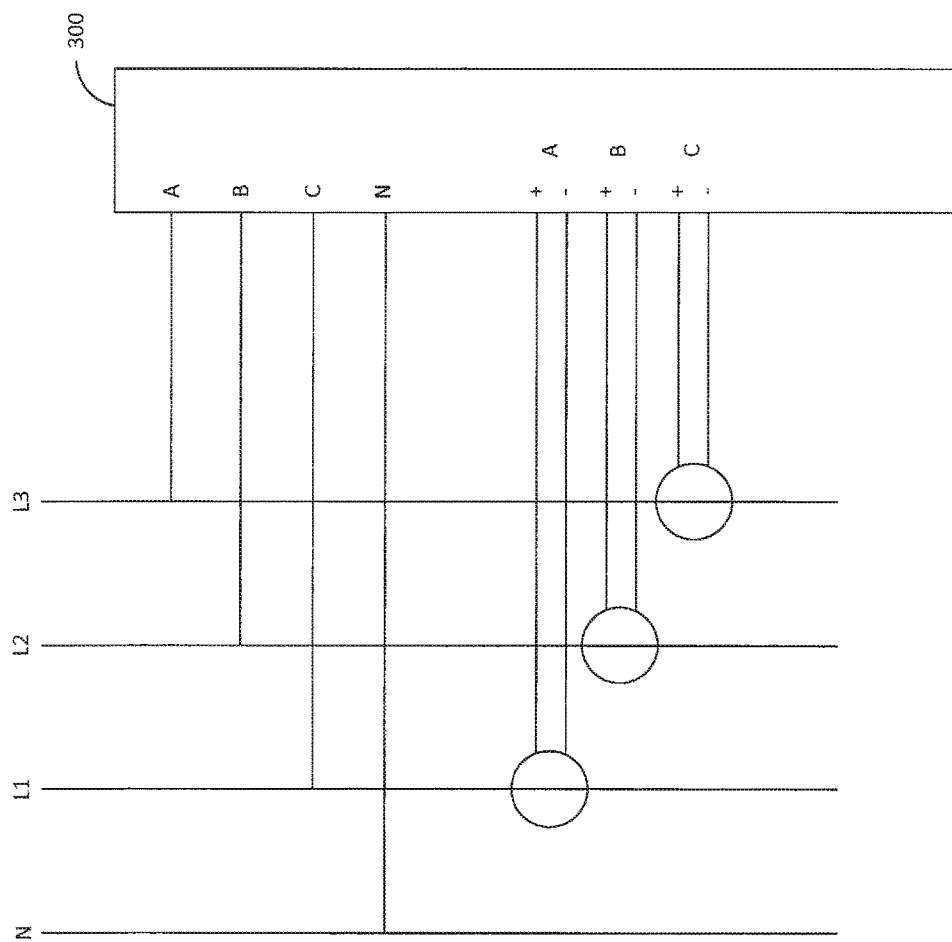
FIG. 10 illustrates one manner of wiring a power meter for sensing voltage and current.

Referring to FIG. 10, an exemplary wiring diagram for a 3-phase 3-wire current transformer with a neural is illustrated. By way of example, the power meter may determine one or more of the following electrical parameters for one or more phases of the input, such as real energy, total instantaneous real power, total instantaneous reactive power, total instantaneous apparent power, total power factor, voltage L-L, voltage average, voltage L-N, current, real power, power factor, voltage phases A-B/B-C/A-C/A-N/B-N/C-N, instantaneous current, frequency, apparent energy consumption, reactive energy consumption, apparent power, reactive power, total real power, total reactive power, total apparent power, etc.

In some embodiments, the power meter may be electrically connected in series with the loads, if desired. As illustrated in FIG. 1 through FIG. 10, the power meter may be in many different configurations and form factors. All or portions of the power meter is preferably housed in a housing. Whether housed in a housing or not housed in a housing, all or portions of the power meter preferably include one or more connectors suitable to detachably connect a separate power meter to sense electrical properties of the power meter, such as the voltage and/or current so that the additional power meter may determine power measurements.

Figure 11:
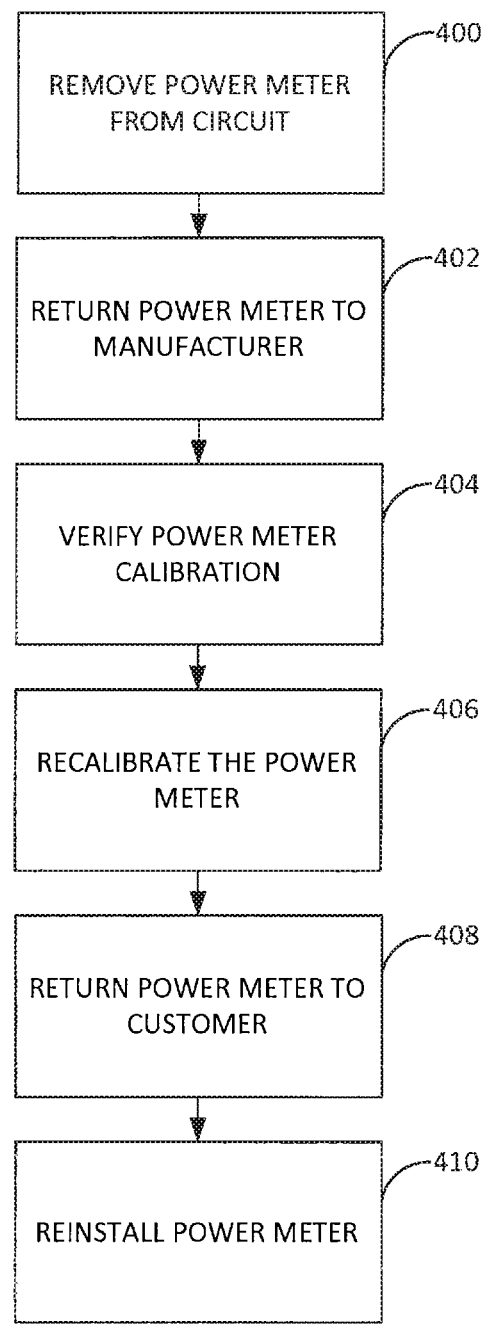
FIG. 11 illustrates a power monitor recalibration process.

Referring to FIG. 11, over time power meters tend to provide less accurate results because the components included therein tend to age and drift. While such less accurate power meters still provide output data, the data may no longer be within a suitable accuracy range, such as within 1 percent. To recalibrate the power meter it traditionally needs to be removed from the circuit 400 and returned to the manufacturer to verify the calibration or otherwise recalibrate the device 402. The calibration of the power meter is then verified by the manufacturer 404. If the calibration is not within a suitable accuracy, such as within 1%, then the manufacturer may attempt to recalibrate the power meter 406. The recalibrated power meter is then returned to the customer 408 which is then reinstalled to continue measuring electrical power 410. Unfortunately, for an active load it may be difficult to remove the power meter because an electrical panel may need to be opened and accessed to remove the power meter. Also, if the power meter is removed the accompanying current transformers may likewise be desirable to be removed which is problematic if the load is active, and especially problematic if the wire needs to be removed from within a non-split core toroidal current transformer. For many electrical environments, the disconnection of the power from the load even if temporary may not be feasible for those devices that are intended to have continuous use. It is even more problematic to remove a power meter located in a hazardous location, such as within particular locations of a nuclear power plant. Further, during the time that the power meter is removed the power meter is not monitoring the power usage, and it is expensive to remove the power meter and recalibrate the power meter by the manufacturer. Also, while the power meter is removed an alarm condition may occur which may jeopardize the safety measures associated with the power meter. Furthermore, the removal of the power meter may result in damage to the power meter, damage to the electrical connections to the power meter, damage as a result of reinstalling the power meter, and errors in the installation of the power meter.

Rather than remove a power meter for recalibration, in some cases a customer may attempt to install a duplicative power meter for the same load. To install a duplicate power meter, the power meter itself needs to be installed in a suitable location such as within a power panel, install a set of voltage taps, install a set of current transformers, and provide control power for the power meter. The results of both of the power meters are compared with one another to attempt to determine whether the calibration is accurate. Unfortunately, in many locations there is not suitable space to install a second power meter within a power panel and even if there is suitable space within the power panel there tends to be errors in the installation of the power meter. By way of example, the current transformers may be interconnected to the wrong wires, the voltage connectors connected to the wrong voltage sources, the alignment of the voltage and current transformers are incorrect and mismatched. Also, if the power levels of the load are relatively low the additional power meter may sufficiently skew the measurements of the power meters. Whether the power meter is removed to verify its calibration or a secondary power meter is installed, it may be difficult to access the power panel because of safety issues related to high voltage and high current environments.

Figure 12:
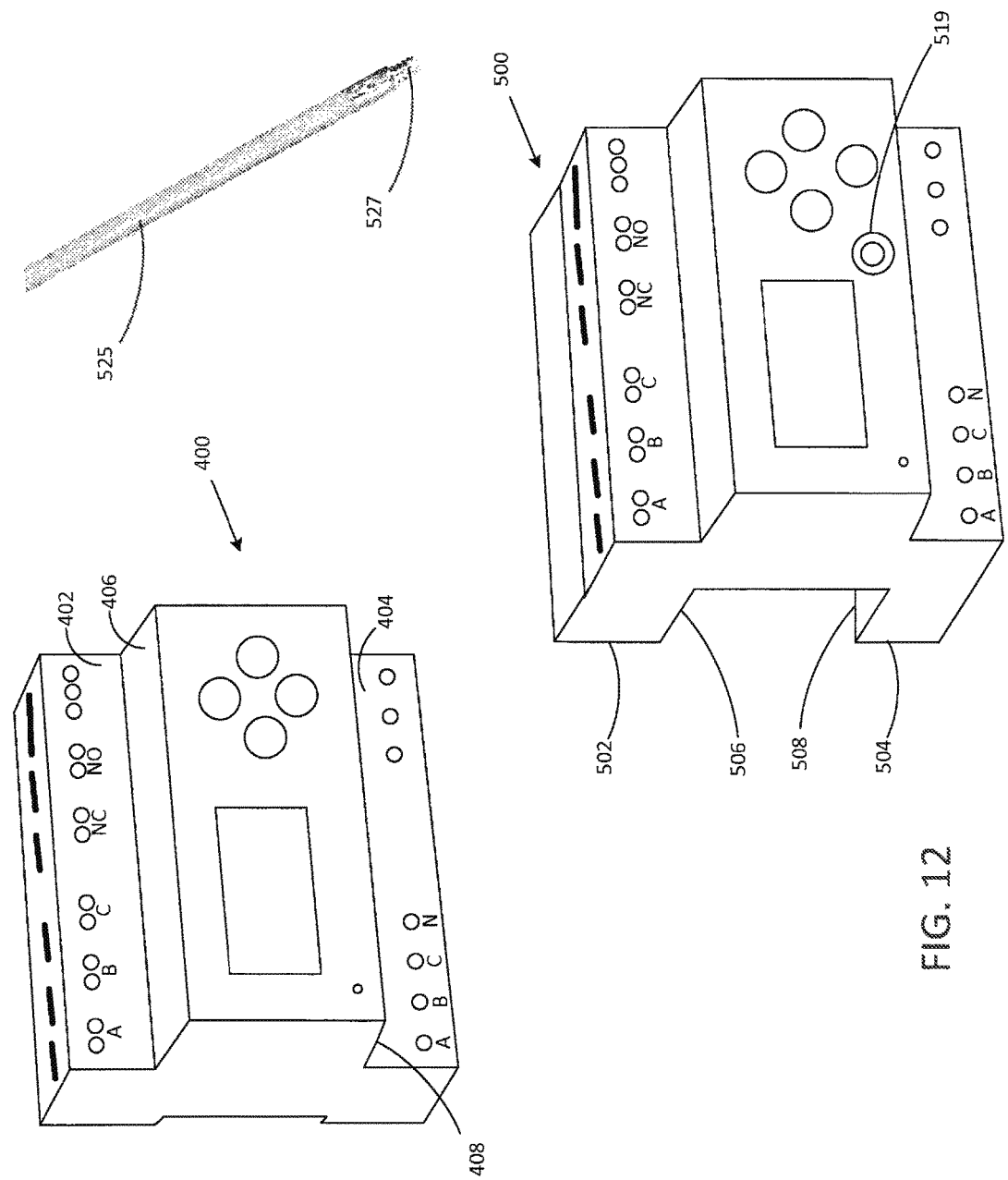
FIG. 12 illustrates a first power meter engaged with a second power meter.

Referring to FIG. 12, the power meter 400 may be similar in configuration to the power meter 300 illustrated in FIG. 9. Other configurations of the power meter may likewise be used, as desired. The power meter 400 may be configured such that it includes exterior upper flat surfaces 402, 404, and exterior upper raised surfaces 406, and 408. A calibration power meter 500 may be configured such that is includes exterior lower flat surfaces 502, 504, and exterior lower raised surfaces 506, 508. The exterior upper flat surfaces 402, 404 and the exterior upper raised surfaces 406, 408 are preferably sized to be detachably engageable with a pressing engagement with the exterior lower flat surfaces 502, 504, and the exterior lower raised surfaces 506, 508. The exterior upper flat surfaces 402, 404 preferably come into face-to-face engagement with the exterior lower flat surfaces 502, 504 when the power meter 400 and the calibration power meter 500 are engaged with one another, preferably based upon a friction engagement of the surfaces. The exterior upper raised surfaces 406, 408 preferably come into face-to-face engagement with the exterior lower raised surfaces 506, 508 when the power meter 400 and the calibration power meter 500 are engaged with one another. Preferably, the face-to-face engagements of the respective surfaces are over at least 25% of their respective surface areas, more preferably at least 50% of their respective surface areas, and more preferably at least 75% of their respective surface areas. The power meter 400 and the calibration power meter 500 may be disengaged with one another by pulling the calibration power meter 500 from the power meter 400 to overcome the frictional engagement. Alternatively or in addition to the frictional engagement, the power meter 400 and the calibration power meter 500 may include a latching mechanism (not shown) where upon engagement of one with the other they lock together to further inhibit their becoming unintentionally disengaged. Also, the calibration power meter 500 may be disengaged from the power meter 400 by unlocking the latching mechanism and removing the calibration power meter 500 from the power meter 400. In this manner, the calibration power meter 500 may be selectively engaged and selectively disengaged from the power meter 400. The selective engagement may include for example being supported by and/or affixed to and/or detachable from, such as in a horizontal stacked arrangement (where the top of the power meters are perpendicular to the ground) and a vertical stacked arrangement (where the top of the power meters are perpendicular to the ground). Preferably an elongate stick 525, such as a long non-electrically conductive stick, is used to engage and disengage the calibration power meter 500 with the power meter 400. Preferably the elongate stick 515 includes a threaded end 517 that engages with a threaded connection 519 to engage and disengage with the calibration power meter 500. When the stick 517 is engaged with the calibration power meter 500, the stick 517 may be used to engage and/or disengage the calibration power meter 500 with the power meter 400.

Figure 13:
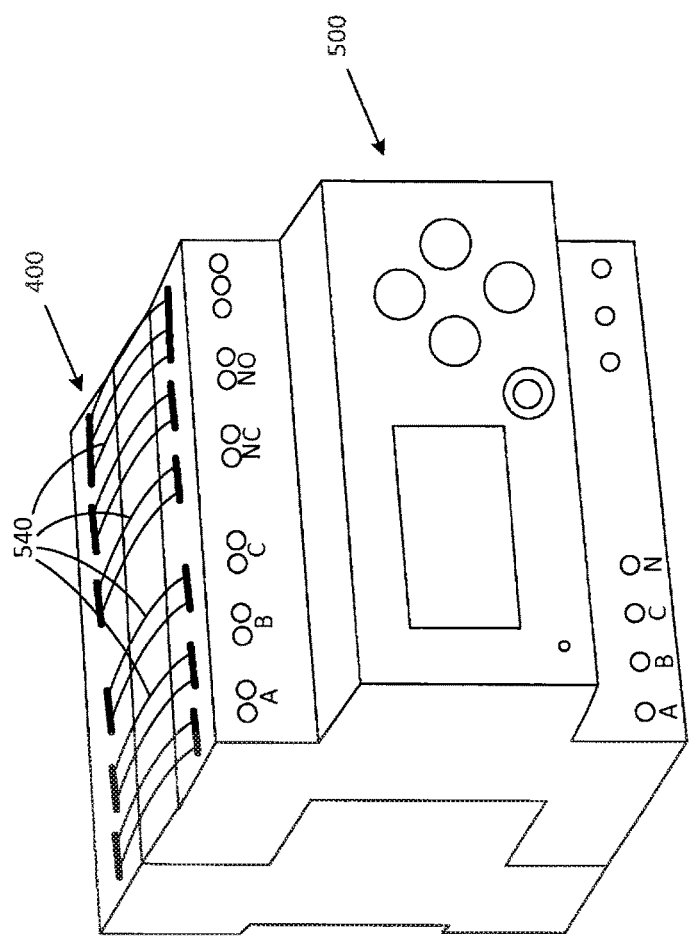
FIG. 13 illustrates a first power meter engaged with a second power together with external connectors.

Referring to FIG. 13, the voltage inputs and the current inputs to the calibration power meter 500 may be electrically interconnected to the voltage inputs and the current inputs of the power meter 400 by relatively short electrical wires 540. This would typically involve engaging the calibration power meter 500 with the power meter 400, and then electrically interconnecting the set of wires 540 between the inputs of the respective power meters. In this manner, the calibration power meter 500 is electrically interconnected in parallel with the power meter 400. While such relatively short electrical wires may be used, it tends to be problematic to install such wires in many locations where the power meters are sensing electrical energy and especially problematic for high voltage and/or high current environments.

Figure 14:
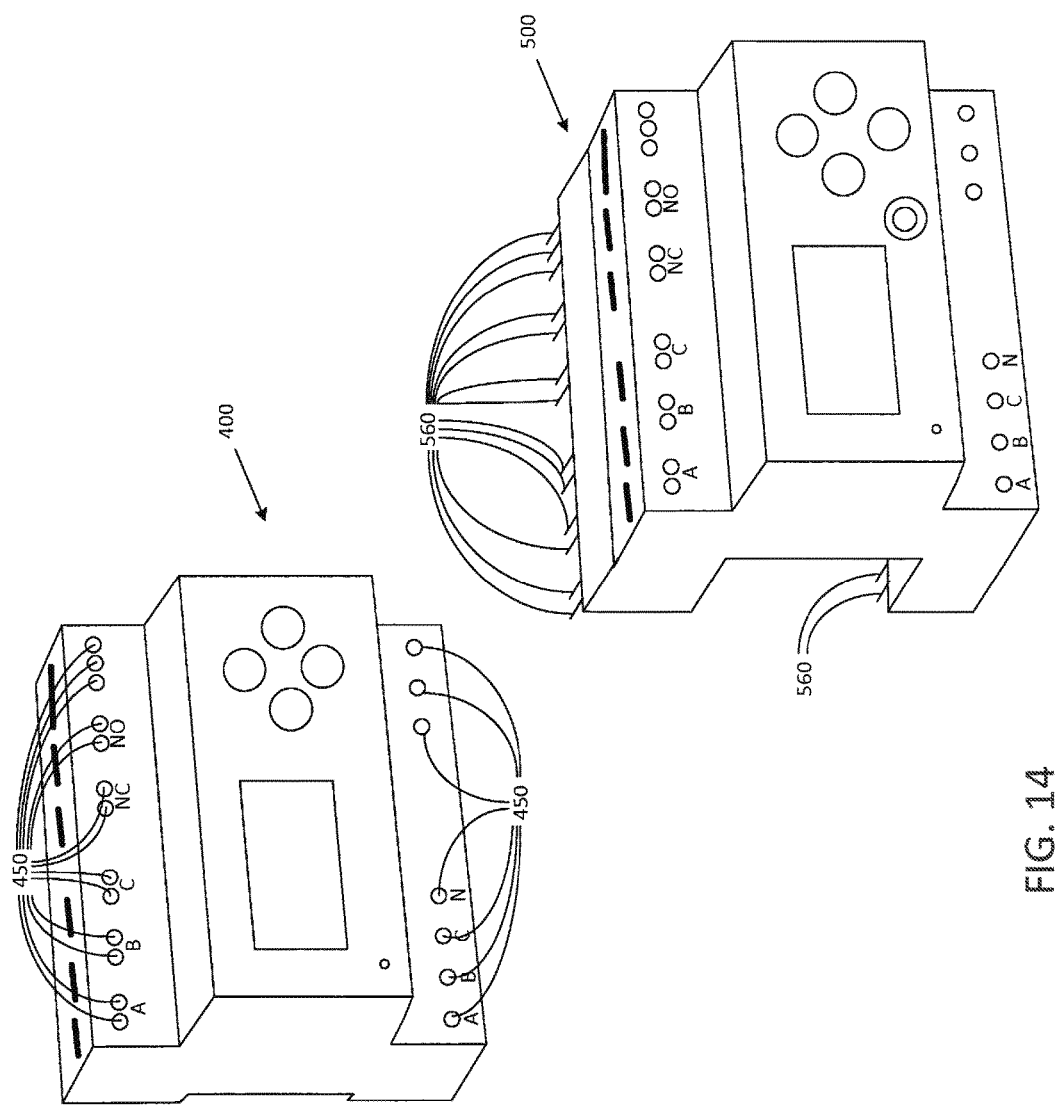
FIG. 14 illustrates a first power meter suitable to be engaged with a second power meter together with pins and receptacles.

Referring to FIG. 14, to alleviate the need to install a set of relatively short wires between the calibration power meter 500 and the power meter 400, it is desirable that the calibration power meter 500 include a set conductive "pins" 560 that protrude from the exterior lower flat surface(s) of the calibration power meter 500. The pins are preferably spaced apart at locations that correspond to the spatial location of the inputs to the power meter 400. The exterior upper flat surface(s) of the power meter 400 preferably include a set of openings 450 that are aligned with the set of conductive "pins" 560 where the pins 560 are inserted into the openings 450 when the calibration power meter is engaged with the power meter 400. Each of the pins 560 are preferably received by an electrical connection mechanism within the power meter 400, such as each pin being received by a pair of deflectable prongs. Each of the deflectable prongs is preferably electrically connected to the corresponding input of the power meter 400 to provide a parallel electrical connection thereto. The other pins may likewise provide voltage and current connections, as desired. In this manner, the calibration power meter 500 is electrically interconnected in parallel with the power meter 400 by a pressing engagement or otherwise a locking mechanism with one another. Accordingly, for example, a first voltage connection is made to the power meter 400 at a suitable location, and a corresponding first voltage connection is made to the calibration power meter 500 by the pin to the calibration power meter 500. Accordingly, for example, a first current connection is made to the power meter 400 at a suitable location, and a corresponding first current connection is made to the calibration power meter 500 by the pin to the calibration power meter 500. In this manner, the calibration power meter 500 receives from the power meter 400 all the necessary inputs to determine suitable power measurements. Moreover, preferably the inputs to the calibration power meter 500 have a sufficiently high impedance so that the measurements of the power meter 400 are not impacted in a meaningful manner, such as meaningfully reducing its accuracy. Also, in this manner, the power meter 400 still determines power measurements which may be used for billing purposes, even during the time that the calibration power meter 500 may be engaged with the power meter 400.

In an alternative embodiment, while the capability of engaging pins to a deflectable prongs from the exterior of the calibration power meter through the exterior of the power meter to effectuate an electrical connection is preferable other electrical interconnections may likewise be used. For example, the upper cover of the power meter 400 may be removed thereby exposing the internal portions of the power meter 400 to which the calibration power meter 500 is electrically engaged therewith. In this manner, the power meter 400 does not need to include external connections to electrically connect to the calibration power meter 500.

In many cases, the power meter is interconnected in serial between the "utility side" of the power source and the "customer side" (e.g., load) for the power consumption. In this manner, the power meter includes the utility side where the power is being provided to the customer side while being sensed by the power meter. In the event that the calibration power meter is electrically interconnected to the customer side of the power meter then the power that the calibration power meter draws to measure the power will necessarily increase the power being sensed by the power meter. Preferably, the calibration power meter is electrically interconnected to the utility side of the power meter so that the power drawn by the calibration power meter does not increase the power being sensed by the power meter. In this manner, the measurement of the power being consumed by the load will not be meaningfully impacted.

The calibration power meter 500 may also include one or more pins that engage with one or more openings in the power meter 400 to provide an analog or a digital data communication between the power meters. Other techniques may be used to provide one way or two way data communication between the calibration power meter 500 and the power meter 400, such as a wire, pressing conductive contacts, or a wireless communication technique. Also, a network based communication device may be used to provide data to and obtain data from the calibration power meter 500 and the power meter 400. The calibration power meter 500 may query the power meter 400 to receive configuration information, such as the data being provided by each register of the device, for the output data that is provided by the power meter 400. Preferably, all of the configuration information is received from the power meter 400, although only some of the configuration information may likewise be received. In this manner, the calibration power meter 500 may be configured, at least in part, in the same or similar manner to that of the power meter 400 so that the data sets that are determined may be compared against one another in a more effective manner to determine whether the calibration of the power meter 400 is sufficiently accurate. Also, the power meter 400 and/or the calibration power meter 500 may be interconnected to a data network to receive data from and provide data to another computing device.

The power meter 400 may include high voltage inputs and/or high current inputs, such as voltages generally above 100 volts and/or currents generally above 1 amp. The power meter 400 may also include low voltage circuits and/or low current circuits, such as voltages generally below 24 volts and/or currents generally below 0.25 amps. To maintain sufficient electrical isolation to maintain safety margins, the high voltage and/or high current portions of the power meter 400 may be spaced a sufficient distance from the low voltage and/or low current portions. In a similar manner, the calibration power meter 500 may include high voltage inputs and/or high current inputs, such as voltages generally above 100 volts and/or currents generally above 1 amp. The calibration power meter 500 may also include low voltage circuits and/or low current circuits, such as voltages generally below 24 volts and/or currents generally below 0.25 amps. To maintain sufficient electrical isolation to maintain safety margins, the high voltage and/or high current portions of the calibration power meter 500 may be spaced a sufficient distance from the low voltage and/or low current portions. With the calibration power meter 500 engaged with the power meter 400, the high voltage inputs and/or high current inputs of both the calibration power meter 500 and the power meter 400 are preferably maintained with a spacing sufficient to maintain electrical isolation for safety margins. In this manner, the combination of the calibration power meter 500 and the power meter 400 maintain the spacing of the combined high and low portions to an extent at least as great as the separate calibration power meter 500 and the power meter 400.

Figure 15:
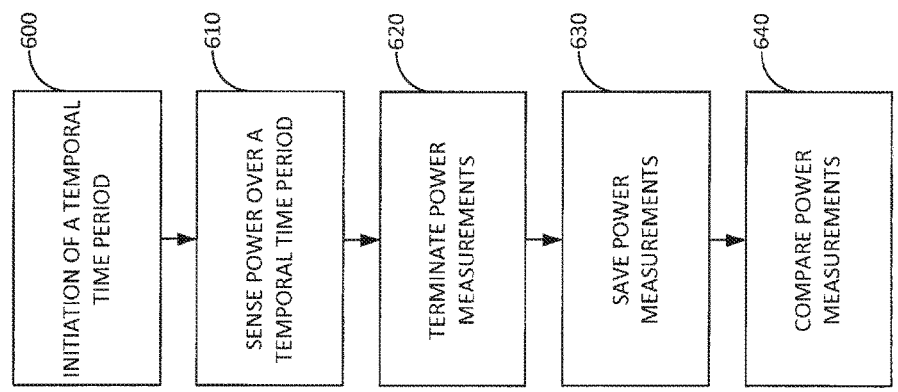
FIG. 15 illustrates a temporal measurement of power.

Referring to FIG. 15, the power measurement of the power meter 400 and the calibration power meter 500 may be temporally synchronized so that the measurements span the same time period. The initiation of a temporal time period 600 may be synchronized by the engagement of the calibration power meter 500 with the power meter 400. Alternatively, the initiation of the temporal time period 600 may be synchronized by a data signal provided by the calibration power meter 500 to the power meter 400, or alternatively a data signal provided by the power meter 400 to the calibration power meter 500, or alternatively a data signal provided through a network to both the power meter 400 and the calibration power meter 500. With the temporal time period initialized, both the power meters sense the power usage during the temporal time period 610. The duration of the temporal time period 610 may be predetermined, may be selected by the power meter 400 that is then provided to the calibration power meter 500, may be selected by the calibration power meter 500 that is then provided to the power meter 400, may be selected by a network device that is provided to either or both of the power meter 400 or the calibration power meter 500, or may be selected by the calibration power meter 500 being disengaged with the power meter 400. In this manner, both of the power meters will gather power related measurements during the same temporal time period. At the end of the temporal time period the power measurements may be terminated 620 and the results of the power measurements are preferably saved in a suitable register 630. As a result of the synchronization of the power measurements, both the power meter 400 and the calibration power meter 500 will sense substantially the same power usage. The resulting power usage sensed by the power meter 400 and the resulting power usage sensed by the calibration power meter 500 may be compared against one another 640 to determine the accuracy of the power meter 400. The comparison may be performed by a network device by reading the power measurements from both the power meter 400 and the calibration power meter 400. The comparison may be performed by the power meter 400 by obtaining the power measurements from the calibration power meter 500, or by the calibration power meter 500 by obtaining the power measurements from the power meter 400.

If the results of the power measurements determines that the calibration is sufficiently accurate, the calibration power meter 500 is preferably disengaged from the power meter 400. If the results of the power measurements determines that the calibration is not sufficiently accurate, the calibration power meter 500 is disengaged from the power meter 400 and the power meter 400 may be removed, recalibrated by the manufacturer, and reinstalled.

Figure 16:
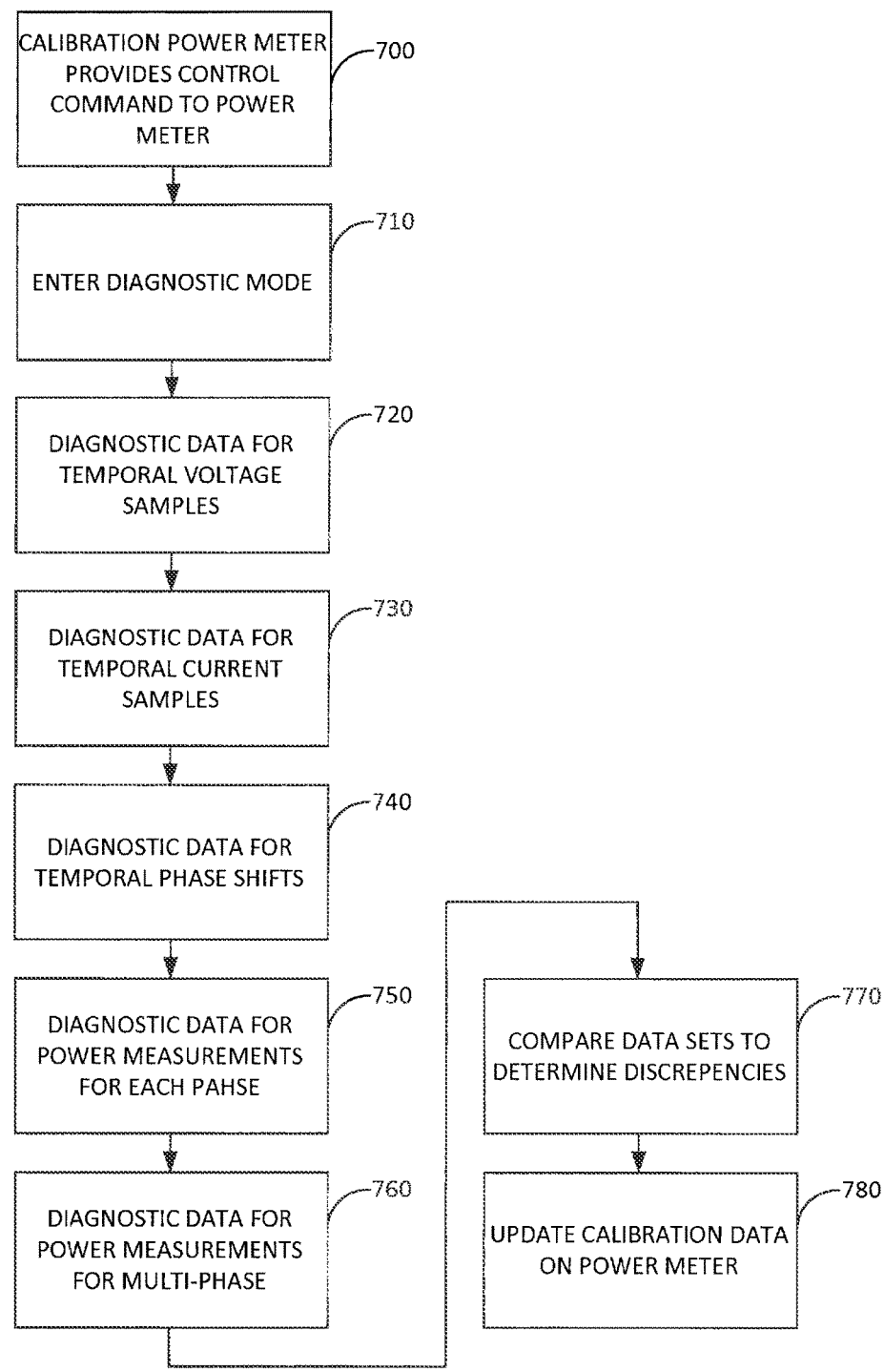
FIG. 16 illustrates a recalibration process.

Referring to FIG. 16, in the event that the power meter 400 is not sufficiently accurately calibrated, the calibration power meter 500 may provide a control command 700 to the power meter 400 to enter a diagnostic mode 710. During the diagnostic mode 710 the power meter 400 and the calibration power meter 500 preferably generate a larger set of diagnostic data so that the source of the differences in the power measurements may be more accurately determined. The larger set of diagnostic data may include for both the calibration power meter 500 and the power meter 400 determining a set of temporal voltage samples for each phase of the voltage inputs 720. The larger set of diagnostic data may include for both the calibration power meter 500 and the power meter 400 determining a set of temporal current samples for each phase of the current inputs 730. The larger set of diagnostic data may include for both the calibration power meter 500 and the power meter 400 determining a set of phase shifts between the voltage and the current for each of the phases 740. Also, the larger set of diagnostic data may include for both the calibration power meter 500 and the power meter 400 determining a set of power measurements for each of the phases 750. Moreover, the larger set of diagnostic data may include for both the calibration power meter 500 and the power meter 400 determining a set of power measurements for each of the multi-phase circuits 760. The calibration power meter 500 may process the diagnostic data to determine discrepancies in the measurements 770. Based upon these discrepancies, the calibration power meter 500 may provide updated calibration data to the power meter 400 which uses the updated calibration data to modify its future measurements. The system may, if desired, perform another set of temporal power measurements to verify that the power meter 400 is sufficiently accurately calibrated as a result of the updated calibration data. In some embodiments, the power meter 400 may compare the diagnostic data and update its calibration. In some embodiments, an external computing device may receive the diagnostic data and provide updates to the power meter 400 to update its calibration data.

The power meter 400 may include one or more registers that provide information about its calibration status and calibration history. For example, the power meter 400 may include information about when it was originally calibrated and the calibration accuracy at that time. If the power meter 400 is subsequently verified in its calibration then the power meter 400 may update its information stored therein of the subsequent date of that calibration and the calibration accuracy at that time. If the power meter 400 is subsequently recalibrated then the power meter 400 may update its information stored therein of the subsequent date of that recalibration and the calibration accuracy at that time. In this manner, the power meter 400 maintains a history of its calibration and/or recalibration together with the calibration accuracy for each. This information may be accessed by a network at any time it is desired, such as for audit purposes.

Figure 17:
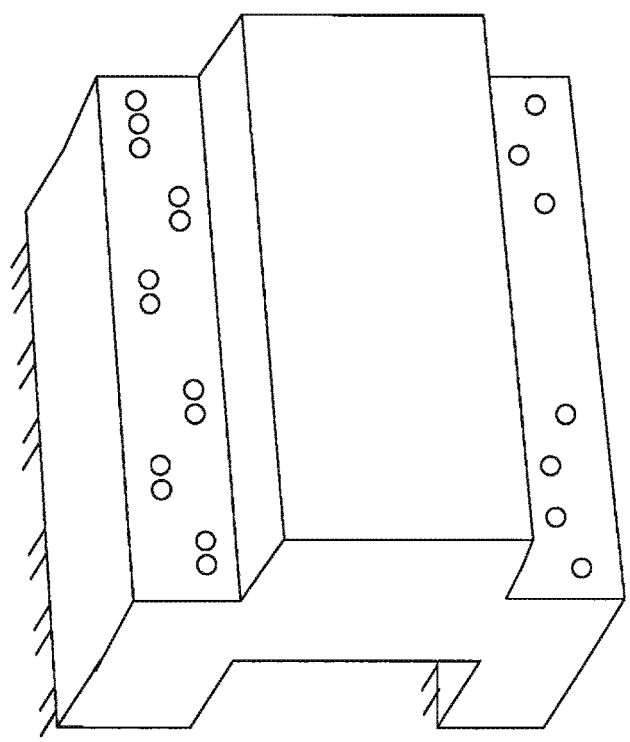
FIG. 17 illustrates a pair of power meters and a spatial translation interface.

Referring to FIG. 17, often the pins of the calibration power meter do not include the appropriate spatial arrangement to match that of the particular power meter. In other cases, the engagement structure of the calibration power meter does not include the appropriate spatial arrangement and/or structures to match that of the particular power meter. This mismatch of the spatial arrangement of the pins and the mismatch of the engagement structure occurs as the result of the power meter having different requirements. However, it is desirable that the same calibration power meter is capable of being effectively used for different power meters. A spatial translation interface may be used to effectively interconnect the calibration power meter with the power meter. A first side of the spatial translation interface includes a set of connectors that are suitable for electrical connection to the calibration power meter and structure for engagement with the calibration power meter. A second side of the spatial translation interface includes a set of connectors that are suitable for electrical connection to the power meter and structure for the power meter. Each of the electrical connections on the first side of the spatial translation interface are electrically connected to one of the electrical connections on the second side of the spatial translation interface.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A method for calibrating a power meter comprising:
   (a) mechanically detachably engaging a first power meter with a second power meter in a manner such that said second power meter is completely mechanically detachable from said first power meter, and detachably electrically engaging said first power meter with said second power meter in a manner such that said second power meter is completely electrically detachable from said first power meter, a first housing substantially enclosing said first power meter, a second housing substantially enclosing said second power meter, wherein said first housing is completely mechanically and electrically separate from said second housing when said first power meter is said completely mechanically detached and said completely electrically detached from said second power meter, said mechanically detachably engaging includes said first housing being in direct mechanical contact with said second housing such that a portion of said first housing comes into direct contact with said second housing, said detachably electrically engaging includes an electrical connection between said first power meter and said second power meter where said electrical connection is configured in a manner that is not capable of being electrically interconnected to another power meter mechanically detachably engaged with said first housing;

(b) receiving by said first power meter a first current input signal representative of a current level in a first conductor to a load;

(c) receiving by said first power meter a first voltage input signal representative of a voltage level in said first conductor;

(d) determining by said first power meter a first power level based upon said first current input signal and said first voltage input signal;

(e) receiving by said second power meter a second current input signal representative of said current level in said first conductor to said load from said first power meter;

(f) receiving by said second power meter a second voltage input signal representative of said voltage level in said first conductor to said load from said first power meter;

(g) determining by said second power meter a second power level based upon said second current input signal and said second voltage input signal.

2. The method of claim 1 wherein said mechanically detachably electrically engaging includes frictional engagement between said first housing and said second housing.

3. The method of claim 1 wherein said mechanically detachably electrically engaging includes a wire external to said first power meter and said second power meter.

4. The method of claim 1 wherein said mechanically detachably electrically engaging includes a conductor integral to at least one of said first power meter and said second power meter.

5. The method of claim 1 wherein said mechanically detachably electrically engaging includes a plurality of extending conductors extending from at least one of said first power meter and said second power meter.

6. The method of claim 5 wherein said plurality of extending conductors include a plurality of pins.

7. The method of claim 1 further comprising said second power meter receiving configuration information from said first power meter.

8. The method of claim 7 wherein said configuration information is said received in response to a query from said second power meter to said first power meter.

9. The method of claim 1 wherein said first power meter has first low voltage circuits and first high voltage circuits that have a first electrical isolation between one another, said second power meter has second low voltage circuits and second high voltage circuits that have a second electrical isolation between one another, and when said first power meter and said second power meter are engaged with one another said first low voltage circuits and said second high voltage circuits have at least said first electrical isolation between one another, and when said first power meter and said second power meter are engaged with one another said second low voltage circuits and said first high voltage circuits have at least said second electrical isolation between one another.

10. The method of claim 1 wherein said first power meter determines said first power level over a temporal time period and said second power meter determines said second power level of said temporal time period.

11. The method of claim 10 wherein said temporal time period is synchronized by a signal from at least one of said first power meter and said second power meter.

12. The method of claim 1 wherein said first power level and said second power level are compared to one another.

13. The method of claim 12 wherein based upon said comparison is used to determine whether said first power meter is sufficiently calibrated.

14. The method of claim 12 wherein said comparison is used to update calibration parameters of said first power meter.

15. The method of claim 14 wherein said updated calibration parameters further include a date associated therewith.

16. The method of claim 1 wherein said first current signal is compared to said second current signal.

17. The method of claim 1 wherein said first voltage signal is compared to said second voltage signal.

18. The method of claim 1 wherein a first phase shift between said first current signal and said first voltage signal is compared to a second phase shift between said second current signal and said second voltage signal.

* * * * *

UNITED STATES PATENT AND TRADEMARK OFFICE
CERTIFICATE OF CORRECTION

PATENT NO. : 10,274,572 B2
APPLICATION NO. : 15/185739
DATED : April 30, 2019
INVENTOR(S) : Martin Cook Page 1 of 1

It is certified that error appears in the above-identified patent and that said Letters Patent is hereby corrected as shown below:

In the Specification

Column 6, Line 35: Delete "mains" and replace with --main--;

Column 6, Line 60: Delete "strips" and replace with --strip--; and

Column 8, Line 22: Delete "neural" and replace with --neutral--.

Signed and Sealed this
Tenth Day of December, 2019

Andrei Iancu
*Director of the United States Patent and Trademark Office*